United States Patent [19]

Nyhus

[11] 4,050,072
[45] Sept. 20, 1977

[54] SIGNAL COMBINING APPARATUS

[75] Inventor: Orville K. Nyhus, Marion, Iowa

[73] Assignee: Rockwell International Corporation, El Segundo, Calif.

[21] Appl. No.: 670,769

[22] Filed: Mar. 26, 1976

[51] Int. Cl.² ............................................. G01S 3/20
[52] U.S. Cl. ...................................... 343/121; 307/3; 323/10
[58] Field of Search ................. 343/121, 844, 851; 323/110; 307/3

[56] References Cited

U.S. PATENT DOCUMENTS 2,327,641   8/1943   Hooven ................................. 343/121

OTHER PUBLICATIONS

IEEE Transactions on Microwave Theory and Techniques, May, 1973, vol. MTT-21, pp. 355–357.

*Primary Examiner*—Maynard R. Wilbur
*Assistant Examiner*—Richard E. Berger
*Attorney, Agent, or Firm*—Bruce C. Lutz; L. Lee Humphries; H. Fredrick Hamann

[57] ABSTRACT

A signal combiner for combining two out-of-phase signals wherein one of these signals increases in amplitude over a range of frequencies at a rate of 6dB per octave. The resultant output signal obtained from the combiner appears to be that of two signals which are in-phase and have a constant ratio of amplitude therebetween. A specific application for this signal combiner is to combine the signals obtained from a sense antenna and from a loop antenna in an automatic direction finding device.

11 Claims, 1 Drawing Figure

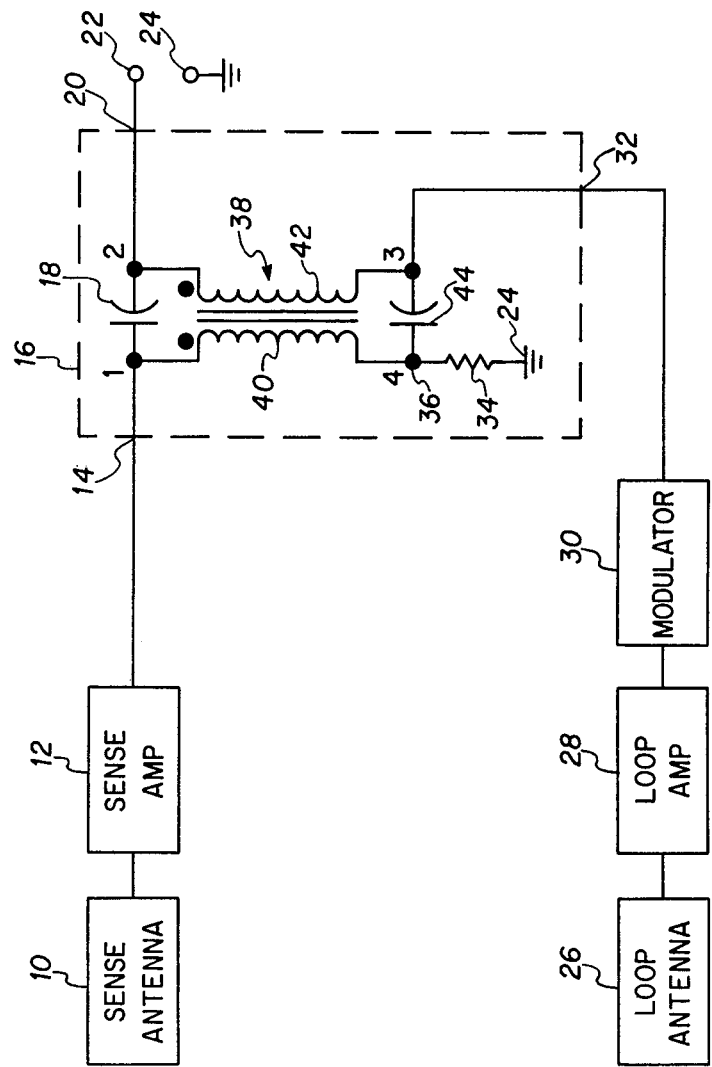

4,050,072

SIGNAL COMBINING APPARATUS

THE INVENTION

The present invention is related generally to electronics and more specifically to a passive system for phase shifting and equalizing two incoming signals with a minimum of parts.

The prior art has accomplished the total function of the present inventive concept by using separate components. In other words, a phase shift circuit, an equalizing circuit and an actual combining circuit were designed separately. An example containing more information relative to signal combining circuits and automatic direction finding apparatus may be found in a Mayer et al. U.S. Pat. No. 3,967,280 issued June 29, 1976 and assigned to the same assignee as the present invention. The phase shift in the prior art was normally accomplished in a lowpass filter circuit. The circuit utilized the concept of band switching to cover the various frequency bands. In order to achieve a 90° phase shift, considerable signal attenuation had to be accepted as a necessary evil. The signal loss was ordinarily compensated by amplifier gain ahead of the filter in order to achieve the required receiver sensitivity. The equalization was normally provided in the prior art by a combination of band switched tuned circuits and the phase shift circuits.

The present invention provides the three functions of phase shift, equalization and combining simultaneously with a simple circuit comprising four components all of which are passive. These components comprise a transformer, two capacitors and a terminating resistor. The combined function is obtained with much less signal attenuation than occurred with the prior art thereby reducing the amplification needed ahead of the signal combiner and in most instances reducing the amplification by at least one amplifier stage. This further reduces the required parts for the overall system. Since the circuit is broadband, no band switching is required thereby further simplifying the design and reducing the total number of system parts.

It is, therefore, an object of the present invention to provide an improved signal combining circuit which includes among its functions equalization and phase shifting.

Other objects and advantages of the present invention may be ascertained from a reading of the specification and appended claims in conjunction with the drawing which comprises a single block-schematic diagram of the inventive concept as used with sense and loop antennas.

In the drawing, a sense antenna 10 supplies signals through a sense amplifier 12 to an input 14 of a dash line block 16. This input 14 is further connected to a first port labeled 1 of the novel circuit. A capacitor 18 is connected between port 1 and a second port 2 which is further connected to an output 20 of the dash line block 16 and further to an output terminal 22. A ground or reference potential terminal 24 is also illustrated. A loop antenna means 26 is illustrated providing a signal through a loop amplifier 28 and a modulator 30 to a further input 32 of block 16. Input 32 is connected to a port designated as 3 within a block 16. A terminating resistive element 34 is connected between ground potential 24 and a fourth port designated both as 4 and 36. A transformer generally designated as 38 has a first winding 40 with one end connected to port 1 and the other end connected to port 4. A second winding 42 has one end connected to port 2 and the other end connected to port 3. As will be noted, dot symbology is used to show like phase signal portions of the transformers connected to ports 1 and 2.

While the loop antenna 26 was described in terms implying that it may be a single loop, the more normal application is a crossed loop or double loop antenna system with corresponding pairs of signals being supplied through the amplifier means 28 and the modulator means 30. These two signals are combined in the modulator means 30 to provide a single set of double sideband modulated signals to the input 32 of combiner 16.

OPERATION

The operation of the present circuit is not easily explained. It may be analyzed according to a method proposed by J. Reed and G. J. Wheeler as presented in the October 1965 issue of *IRE Transactions on Microwave Theory and Techniques* entitled, A Method of Analysis of Symmetrical Four Port Networks, and commencing on page 246 of this publication. The analysis requires analysis in both the odd and even modes. The even mode analysis will provide a determination that the circuit behaves as though terminals 1 and 2 are directly connected and terminals 3 and 4 are likewise connected. In the even mode analysis, the transformer acts as an inductor with an inductance L. In the odd mode analysis, it may be determined that the current in one direction through winding 40 of the transformer is exactly balanced by an opposite direction current in winding 42 of this transformer. Thus, there will be no flux in the transformer core and no voltage drop across the transformer. Therefore, the capacitors 18 and 44 are effectively connected directly in parallel in this mode of analysis.

If the equations obtained from the odd and even mode analysis are combined, it will be determined that the phase at port 2 minus the phase at port 4 is 90° over a design range of frequencies. An identical phase relationship exists between port 1 and port 3. The 90° phase shift is important since the induced voltages obtained from the sense and loop antennas are inherently 90° out-of-phase. This occurs because the sense antenna is normally a monopole and its voltage is induced in a primarily capacitance sense by the electric field of the received signal while the loop antenna voltage is inductively induced by the magnetic field. The electric and magnetic fields are in phase with each other and the electrically induced sense antenna voltage is in phase with the electromagnetic fields. However, the magnetically induced voltage in the loop reaches its maximum when the magnetic field undergoes its maximum rate-of-change (rather than at the maximum amplitude of the field). Thus, the magnetically induced voltage lags the electrically induced voltage by 90°.

The RF output voltage of the loop is in phase quadrature (90° out-of-phase) with the output voltage of the sense antenna for frequencies not near loop resonance. The present invention is only concerned with frequencies below the loop resonance. At these frequencies, the modulated loop signals are in phase quadrature with the sense signal. However, at the point where the sense signal and the modulated loop signal, which is a double sideband (DSB) signal, are combined in the receiver to form an amplitude modulated ADF waveform, such as at terminal 22, the sense and modulated loop signals must be in-phase. If the two signals are not in-phase, an inefficient conversion of double sideband (DSB) to amplitude modulation (AM) results and there is further a generation of unwanted frequency modulation (FM).

In one application of the invention, the hybrid within block 16 acted to equalize the loop antennas' frequency response whereby a constant loop to sense voltage ratio was produced over an entire range of signals from 200 kHz to 1750 kHz. Since the loop to sense ratio remained constant, the amplitude modulation level did not vary.

As is known to those skilled in the art, and as was further implied previously, the sense signal has a constant amplitude with changes in frequency over a given frequency range of signals whereas the loop antenna signal increases in direct proportion to the frequency.

It was found for the circuits shown over the design range mentioned above that at the lower end of this range the signals input at ports 1 and 3 were phase shifted approximately 45° each to place them in-phase at the output terminal 20. At the high end of the range, the sense signal was phase shifted very little while the loop antenna signal was phase shifted very close to 90°.

From the analysis performed using even and odd mode approaches, it will be determined that the sense signal will be split between ports 2 and 4 as follows:

$$V_2 \text{sense} = \frac{\frac{1}{2} V \text{sense}}{1 - j\omega_o/\omega} = \frac{\frac{1}{2} V \text{sense}}{\sqrt{1 + (\omega_o/\omega)^2}} \underline{|\text{tangent}^{-1} \omega_o/\omega}$$

$$V_4 \text{sense} = \frac{\frac{1}{2} V \text{sense}}{1 + j\omega/\omega_o} = \frac{\frac{1}{2} V \text{sense}}{\sqrt{1 + (\omega/\omega_o)^2}} \underline{|-\text{tangent}^{-1} \omega/\omega_o}$$

The above equations apply where the frequency $\omega_o$ is the design center frequency of the hybrid circuit.

The loop signal will be split between ports 2 and 4 as follows:

$$V_2 \text{loop} = \frac{\frac{1}{2} V \text{loop}}{1 + j\omega/\omega_o} = \frac{\frac{1}{2} V \text{loop}}{\sqrt{1 + (\omega/\omega_o)^2}} \underline{|-\text{tangent}^{-1} \omega/\omega_o}$$

$$V_4 \text{loop} = \frac{\frac{1}{2} V \text{loop}}{1 - j\omega_o/\omega} = \frac{\frac{1}{2} V \text{loop}}{\sqrt{1 + (\omega_o/\omega)^2}} \underline{|\text{tangent}^{-1} \omega_o/\omega}$$

The same limitation on the frequency $\omega_o$ applies as previously discussed in connection with the sense signals.

Note that $-\tan^{-1}(\omega/\omega_o) = \tan^{-1}(\omega_o/\omega) - 90°$. This identity illustrates the 90° phase relationship between ports 2 and 4 or ports 1 and 3.

As may be ascertained, the combined voltage at port 2 is the sum of the sense and loop voltages defined above. While the signals are not used at port 4 in the present illustration, these signals are also the combined quantities of $V_4$ listed above. Ideally, and theoretically, no sense signal appears at port 3 and no loop signal appears at port 1. It should be noted that the resistance 34 is a terminating resistance and should be matched to and by the output impedances of the sense amplifier 12, the modulator 30 and the input impedance of the device connected to output terminal 22.

From the following equations, it will be ascertained that the ratio of the absolute magnitude of the signal attributed to the sense antenna as compared to the absolute magnitude of the signal attributed to the loop antenna is a constant and that the signals are of like phase:

$$V_2 \text{sense} = \frac{\frac{1}{2} K_s}{1 - j\omega_o/\omega} = \frac{\frac{1}{2} K_s}{\sqrt{1 + (\omega_o/\omega)^2}} \underline{|\text{tangent}^{-1} \omega_o/\omega}$$

$$V_2 \text{loop} = \frac{\frac{1}{2} j\omega k_l}{1 + j\omega/\omega_o} = \frac{\frac{1}{2} \omega_o k_l}{1 - j\omega_o/\omega} =$$

$$\frac{\frac{1}{2} \omega_o k_l}{\sqrt{1 + (\omega_o/\omega)^2}} \underline{|\text{tangent}^{-1} \omega_o/\omega}$$

$$\left| \frac{V_2 \text{loop}}{V_2 \text{sense}} \right| = \frac{\omega_o k_l}{K_s} = \text{Constant}$$

$$\underline{|V_2 \text{sense}} = \underline{|V_2 \text{loop}}$$

The signal loss at port 2 depends upon both the actual frequency $\omega$ and the design center frequency $\omega_o$. If $\omega_o$ is selected near the low end of the operating frequency band, the loss will be minimized. The lost power is dissipated at port 4. The voltage under these conditions at port 1 is that $V_1 = (\frac{1}{2}) K_s E$ and at port 3 is that $V_3 = (\frac{1}{2}) j\omega k_l$ where $E$ is the electric field strength of the received signal, $K_s$ is a constant describing the effective height of the sense antenna and the voltage gain of the sense amplifier, and $k_l$ is similarly a constant describing the performance of the loop antenna, the loop amplifier, and the modulator. If the design frequency $\omega_o$ is the lower band edge to be used and which may be designated as $\omega_1$, the sense signal would suffer a 3dB loss at $\omega_1$ in the same fashion as would the loop signal. For higher frequencies, the sense signal loss would be less and the loop signal (which increases in amplitude with frequency) would be attenuated more (by dissipation at port 4) to maintain a level at port 2 which gives a constant loop-to-sense signal ratio at port 2. If the design frequency $\omega_o$ were placed at a lower value, a flatter response curve would be obtained for the sense signal, but it would waste more loop signal power at the low end of the band.

The completion of the analysis and desired results illustrate that the inductance of the transformer 38, which would normally be a one-to-one ratio, would have as the transformer winding inductance in each of the windings a value equal to the terminating resistance such as 34 $\div$ $\omega_o = 2\pi f_o$ and where $f_o$ is a frequency selected in the system design at which the loop loss is equal to the sense signal loss. The value of each of the capacitors 18 and 44 would be the fraction $1/(2 R_t \omega_o)$ where $R_t$ is again the terminating resistance 34 and $\omega_o$ is the same as defined above.

It should be noted from the IEEE Transactions on Microwave Theory and Techniques, May 1973, in an article entitled Broadband Twisted-Wire Quadrature Hybrids by R. E. Fisher that an apparently identical circuit is shown on page 356 thereof. The hybrid circuit discussed by Fisher is used as a power divider wherein a signal is supplied at port 1 and output at ports 2 and 4. There is no discussion in this article that the dividing circuit should be used as a signal combiner and as will be realized from an examination of the article and equations presented, the analysis was not complete enough to even suggest such a possibility.

In view of the above, it will be realized that although the circuit illustrated by Fisher (ignoring inputs and outputs and use) is apparently the same as that illustrated in the present invention, the use is completely different and the teaching is accordingly completely different since the present inventive concept requires a much deeper analysis and understanding of the circuit and is used in a completely different situation, i.e., the Fisher device is for splitting signals and the present device is for combining signals. Thus, the teaching of Fisher is not usable for combining signals. Further, the Fisher device does not in one simple circuit provide equalization or phase shift over a wide band of frequencies since this is not of concern to Fisher.

In view of the above, I believe that I have a new and novel concept related to combining of signals and wish to include all reasonable modifications of the invention as may be obtained from the teachings above and thus wish to be limited only by the scope of the appended claims.

I claim:

1. Signal combining means comprising, in combination:
   transformer means including first and second windings each having first and second ends;
   first capacitive means connected between said first ends of each of said first and second windings;
   second capacitive means connected between said second ends of each of said first and second windings;
   sense antenna means connected to said first end of said first winding for supplying a first signal thereto;
   loop antenna means connected to said second end of said second winding for supplying a second signal thereto; and
   signal output means connected to one of the remaining ends of said windings for receiving a signal therefrom indicative of the combination of said first and second signals.

2. Apparatus as claimed in claim 1 comprising, in addition:
   reference potential means; and
   impedance means connected between said reference potential means and the remaining end of said windings, each end of said windings being terminated by substantially the same impedance.

3. Combining apparatus for sense and loop antenna signals comprising, in combination:
   first means for receiving first input signals indicative of direction of a received signal wherein said first signals increase in amplitude with an increase in frequency;
   second means for receiving second input signals indicative of sense of the received signal and phase shifted 90 degrees, and with respect to said first signal and said second signals are constant in amplitude with changes in frequency; and
   combining means, connected to said first and second means, said combining means including output means, for supplying a combined output signal to said output means indicative of a constant amplitude ratio in phase combination of said first and second signals.

4. Apparatus as claimed in claim 3 wherein:
   said combining means includes a 1:1 transformer and two capacitors.

5. Apparatus as claimed in claim 3 wherein:
   said combining means includes a transformer having one end of a first winding connected to said first means, and one end of a second winding connected to said second means.

6. The method of combining two out-of-phase signals to produce a resultant signal indicative of an in-phase combination comprising, the steps of:
   supplying a first in-phase signal to a first winding of a transformer;
   supplying a second quadrature phase signal to a second winding of said transformer;
   phase shifting one of said signals so that said first and second signals are the same phase; and
   providing a combined output signal indicative of the sum of said first and second signals as phase shifted.

7. The method of claim 6 wherein the first and second signals change in relative amplitude over a range of frequencies, comprising the additional step of equalizing said first and second signals to obtain a constant amplitude ratio.

8. The method of combining two quadrature phase signals having a varying amplitude ratio over a given range of frequencies to produce a resultant signal indicative of a constant amplitude ratio, in-phase combination comprising the steps of:
   inductively coupling said first and second signals in first and second opposing windings of a transformer;
   capacitively coupling one winding of the transformer to the other to shift the phase of at least one of the signals; and
   summing the inductively and capacitively coupled signals to provide a resultant output signal.

9. Out-of-phase signal combining circuit means for providing a resultant output signal indicative of the in-phase combination of signals supplied comprising, in combination:
   transformer means including first and second ends;
   capacitive means ($C_1$) connected between the first ends of said windings;
   further capacitive ($C_2$) means connected between the second ends of said windings; and
   terminating resistance means (R) connected to each end of each winding where $R = L2\pi f = 1/(4\pi fC)$, where $L$ is the transformer winding inductance, $f$ is a selected frequency of operation and $C_1 = C_2 = C$.

10. Apparatus for combining two out-of-phase signals to produce a resultant signal indicative of an in-phase combination comprising, in combination:
    means for supplying a first in-phase signal to a first winding of a transformer;
    means for supplying a second quadrature phase signal to a second winding of said transformer;
    phase shifting means, including said transformer, connected to said last two mentioned means for shifting the last one of said signals so that said first and second signals are of the same phase; and
    further means functioning as part of said phase shifting means for summing said first and second signals after phase shifting.

11. Apparatus for combining two quadrature phase signals having a varying amplitude ratio over a given range of frequencies to produce a resultant signal indicative of a constant amplitude ratio, in-phase combination comprising, in combination:
    means for supplying quadrature phase first and second signals;
    means connected to said last mentioned means for inductively coupling said first and second signals in first and second opposing windings of a transformer;
means for capacitively coupling one winding of the transformer to the other winding of the transformer whereby the phase of at least one of the signals is shifted in phase; and
means for summing the inductively and capacitively coupled signals to produce a resultant output signal.

* * * * *